US011622460B2

(12) United States Patent
Thrailkill (10) Patent No.: US 11,622,460 B2
(45) Date of Patent: Apr. 4, 2023

(54) HERMETIC FASTENER-LESS ENCLOSURES AND METHODS OF SEALING THE SAME

(71) Applicant: Advanced Illumination, Inc., Rochester, VT (US)

(72) Inventor: John Thrailkill, Shelburne, VT (US)

(73) Assignee: Advanced Illumination, Inc., Rochester, VT (US)

( * ) Notice: Subject to any disclaimer, the term of this patent is extended or adjusted under 35 U.S.C. 154(b) by 226 days.

(21) Appl. No.: 16/949,245

(22) Filed: Oct. 21, 2020

(65) Prior Publication Data

US 2021/0127519 A1 Apr. 29, 2021

Related U.S. Application Data

(60) Provisional application No. 62/925,020, filed on Oct. 23, 2019.

(51) Int. Cl.
*H05K 5/06* (2006.01)

(52) U.S. Cl.
CPC .............. *H05K 5/061* (2013.01); *H05K 5/062* (2013.01)

(58) Field of Classification Search
CPC ...... H05K 5/03; H05K 5/0217; H05K 5/0095; H05K 5/06; H05K 5/061; H02G 3/08; H02G 3/088; H02G 3/14
See application file for complete search history.

(56) References Cited

U.S. PATENT DOCUMENTS

| 5,422,766 | A | 6/1995 | Hack et al. |
| 5,477,009 | A | 12/1995 | Brendecke et al. |
| 6,525,899 | B2 | 2/2003 | Hearn et al. |
| 6,629,365 | B2 | 10/2003 | Denzene et al. |
| 6,659,274 | B2 | 12/2003 | Enners |
| 8,735,721 | B2 | 5/2014 | Pan |
| 9,843,659 | B2 | 12/2017 | Yamaguchi et al. |
| 9,890,945 | B2 | 2/2018 | Lazalier |
| 10,039,197 | B2 | 7/2018 | Drew et al. |
| 10,779,422 | B2 | 9/2020 | Wilson et al. |
| 2003/0173100 | A1* | 9/2003 | Flaherty ................. H05K 5/061 174/359 |
| 2004/0080939 | A1* | 4/2004 | Braddell ............. H01L 25/0753 362/240 |

(Continued)

FOREIGN PATENT DOCUMENTS

| DE | 102017106218 A1 | 9/2018 |
| KR | 20140016052 A | 2/2020 |

(Continued)

OTHER PUBLICATIONS

Kenall, "SimpleSeal Brochure." https://kenall.com/Kenall-Files/Product-Files/LitSpreads/Kenall_SimpleSeal_Brochure/Kenall_Simple-Seal-2018.html#page=18 (Last viewed on Sep. 23, 2020).

*Primary Examiner* — Hoa C Nguyen
*Assistant Examiner* — Amol H Patel
(74) *Attorney, Agent, or Firm* — Downs Rachlin Martin PLLC (57) ABSTRACT

Hermetically sealed, hygienic electrical enclosures that do not require mechanical fasteners and methods of making the same. In some examples, an open housing is sealed with a cover using a seal that includes an arrangement of a gasket and a sealant. Once cured, the seal provides a hermetic seal between the housing and cover, providing a crevice-free device enclosure.

24 Claims, 5 Drawing Sheets

(56) References Cited

U.S. PATENT DOCUMENTS

| | | |
|---|---|---|
| 2007/0024011 A1 | 2/2007 | Michaud et al. |
| 2016/0033122 A1* | 2/2016 | Sakigawa ............ G03B 21/145 |
| | | 445/44 |
| 2020/0072353 A1 | 3/2020 | Bury et al. |
| 2020/0248811 A1* | 8/2020 | Fukuyama ............... H05K 5/06 |
| 2021/0246982 A1* | 8/2021 | Togo ...................... H05K 5/061 |
| 2021/0251094 A1* | 8/2021 | Okamoto ................. F16J 15/14 |
| 2022/0136665 A1* | 5/2022 | Furlaneto Filho .... F21V 23/001 |
| | | 362/311.02 |
| 2022/0225516 A1* | 7/2022 | Saito ....................... H05K 5/06 |

FOREIGN PATENT DOCUMENTS

| | | |
|---|---|---|
| WO | 2002048584 A1 | 6/2002 |
| WO | 2019154508 A1 | 8/2019 |

* cited by examiner

HERMETIC FASTENER-LESS ENCLOSURES AND METHODS OF SEALING THE SAME

RELATED APPLICATION DATA

This application claims the benefit of priority of U.S. Provisional Patent Application Ser. No. 62/925,020, filed Oct. 23, 2019, and titled "Hermetic Fastener-Less Electronics Enclosures and Methods of Sealing the Same", which is incorporated by reference herein in its entirety.

FIELD OF THE INVENTION

The present disclosure relates generally to hermetically sealed enclosures. In addition, the present disclosure relates to the development of crevice-free, hygienic enclosures that are particularly useful during the manufacture of food or medical products.

BACKGROUND

Electrical equipment that is used during the production of food or medical products must meet certain hygienic standards of cleanability to remain in compliance with a wide variety of regulatory requirements, such as an IP code published by the International Electrotechnical Commission (IEC) or a rating under the European EN 60529 standard. Standards such as IP codes classify and rate the degree of protection provided by mechanical casings and electrical enclosures against intrusion, dust, accidental contact, and water. For example, IP69K indicates an enclosure is dust tight and protected against close-range high pressure, high temperature spray downs. Equipment enclosures often utilize a system of gaskets and mechanical fasteners to provide an air and liquid-tight seal between the enclosure base and a lid or cover. The crevices created around the gasket and fasteners, however, can be hard to reach during a cleaning process and provide fertile ground for the growth of bacteria and other contaminating biological growths.

SUMMARY OF THE DISCLOSURE

In one implementation, the present disclosure is directed to an enclosure. The enclosure includes a housing that includes a plurality awaits, each of the walls having a stepped recess in a top portion of the wall that includes a support shelf; a removeable cover disposed on the support shelf, wherein an outer edge of the cover and the stepped recess define a channel; and a seal disposed in the channel, the seal including a gasket and a sealant that fills a remainder of the channel.

In another implementation, the present disclosure is directed to a method of manufacturing an enclosure that includes a housing having a stepped recess in a top portion of the housing and a removable cover. The method includes locating the removeable cover in the stepped recess of the housing to thereby form a channel located between the removeable cover and the stepped recess, placing a gasket in the channel; and filling the channel with a fluid sealant, wherein the fluid sealant cures into a rubberized solid after installation.

BRIEF DESCRIPTION OF THE DRAWINGS

For the purpose of illustration, the drawings show aspects of one or more embodiments of the disclosure. However, it should be understood that the present disclosure is not limited to the precise arrangements and instrumentalities shown in the drawings, wherein.

DETAILED DESCRIPTION

Figure 1:
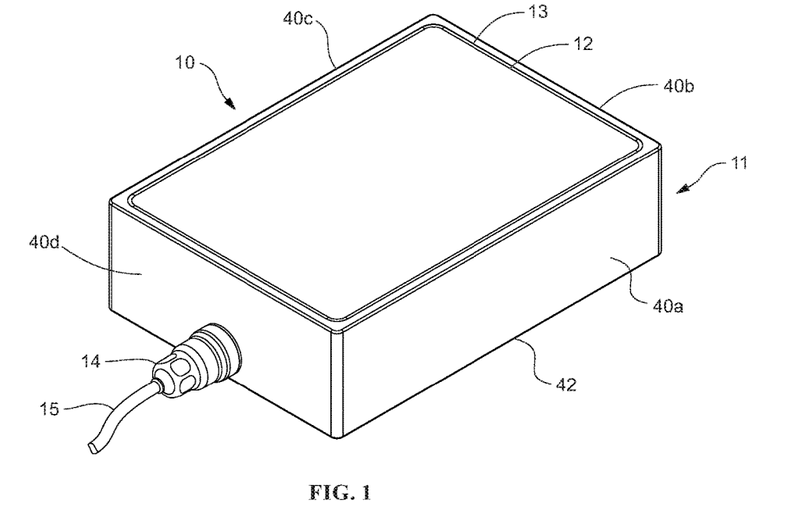
FIG. 1 is a perspective view of a sealed electrical enclosure with exiting cable and cord grip in accordance with the present disclosure.

Aspects of the present disclosure include hygienic enclosure systems that are crevice-free and that, with proper cleaning procedures, greatly reduce or eliminate the growth of biological contaminants on the surfaces of the enclosure. With reference now to the attached drawings, FIG. 1 illustrates one example of an assembled electrical enclosure 10 of the present disclosure. Electrical enclosure 10 includes a housing 11, which includes four walls 40a, 40b, 40c, and 40d and a base 42. Enclosure 10 also includes a removeable cover 12, a sealant 13 located between walls 40 and cover 12, a cord grip 14 and an electric cable 15.

Figure 4:
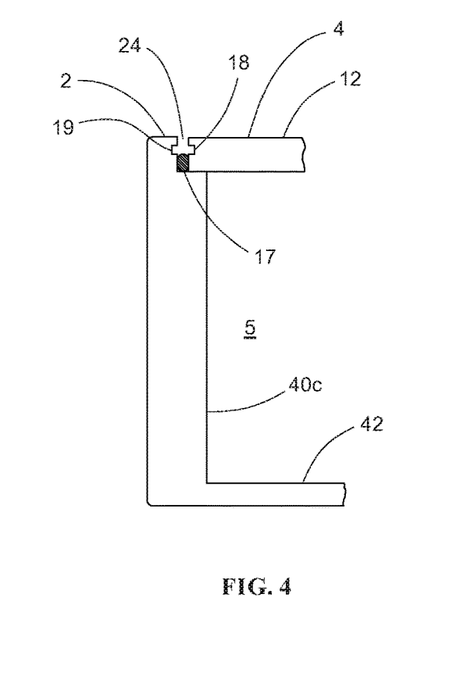
FIG. 4 is a cross-sectional side view of the electrical enclosure of FIGS. 1 and 2.

FIG. 4 shows a cross sectional side view of a portion of enclosure 10. As shown in FIG. 4, top surfaces 2 and 4 of the walls 40 and cover 12, respectively, are substantially flush and in-plane with each other. When assembled, a top surface of sealant 13 (not illustrated in FIGS. 4 and 5) located in channel 24 is also substantially flush and in-plane with top surfaces 2 and 4, providing a crevice-free, hermetically sealed juncture between the housing 11 and the cover 12. Enclosure 10 defines a cavity 5 and is designed and configured to house one or more electrical components 25 (see, e.g., FIG. 2) in the cavity. In one example, cover 12 is an optical component and electrical components 25 include light emitting devices that are configured to emit light through cover 12 to illuminate a space, volume, or surface proximate enclosure 10. Electrical components 25 may include any light emitting technology known in the art, such as light emitting diodes and corresponding drive circuitry coupled to printed circuit board(s) configured to emit one or more wavelengths of electromagnetic radiation in the ultraviolet, visible and/or infrared spectrum. Cover 12 is configured to perform desired mechanical properties of the enclosure 10, for example, mechanical properties for meeting the enclosure requirements of a particular specification, such as IP69K. And in some examples cover 12 may also be configured as an optical component containing one or more elements designed and configured to meet optical requirements including to transmit at least a portion of light emitted by electrical components 25. For example, cover 12 may include one or more elements configured and dimensioned as one or more of a window, diffuser, collimator, and lens, such as a Fresnel lens. Cover 12 may be formed from a variety of materials, such as acrylic, polycarbonate and/or glass. In some examples, base 42 and/or one or more of walls 40 may also be configured as an optical component and configured to transmit light therethrough and/or configured to absorb or reflect at least a portion of light emitted by electrical components 25.

In some examples, enclosure 10 may be designed and configured as a backlight that may be used in an industrial machine vision application. For example, enclosure 10 may be configured to provide an area of uniform illumination oriented behind an object of interest for creating a part silhouette of instant contrast between dark and light, which may be used for edge detection, part location/orientation or presence/absence, hole detection and object gauging. Enclosure 10 may also be configured as a linear backlight that may be deployed behind a moving web of material when used in conjunction with line scan cameras, where light intensities may be sufficient to freeze motion. In yet other examples, cover 12 may not be an optical component and enclosure 10 may not be configured to emit light and, instead, enclosure 10 may be designed to securely enclose any type of electrical components other than light-emitting devices or otherwise provide a hermetically sealed cavity 5 for the secure protection of one or more items.

In one example, housing 11 is a unitary or one-piece component and can be formed from any of a variety of materials, such as stainless steel, carbon steel, aluminum, brass, copper or any number of solid polymers. In some examples, an exterior surface of housing 11 may be resistant to corrosion, for example, a nickel finish for corrosion protection. And housing 11 may be designed and configured to have a high thermal conductivity to maximize the dissipation of thermal energy generated by electrical components located in the housing.

Figure 6:
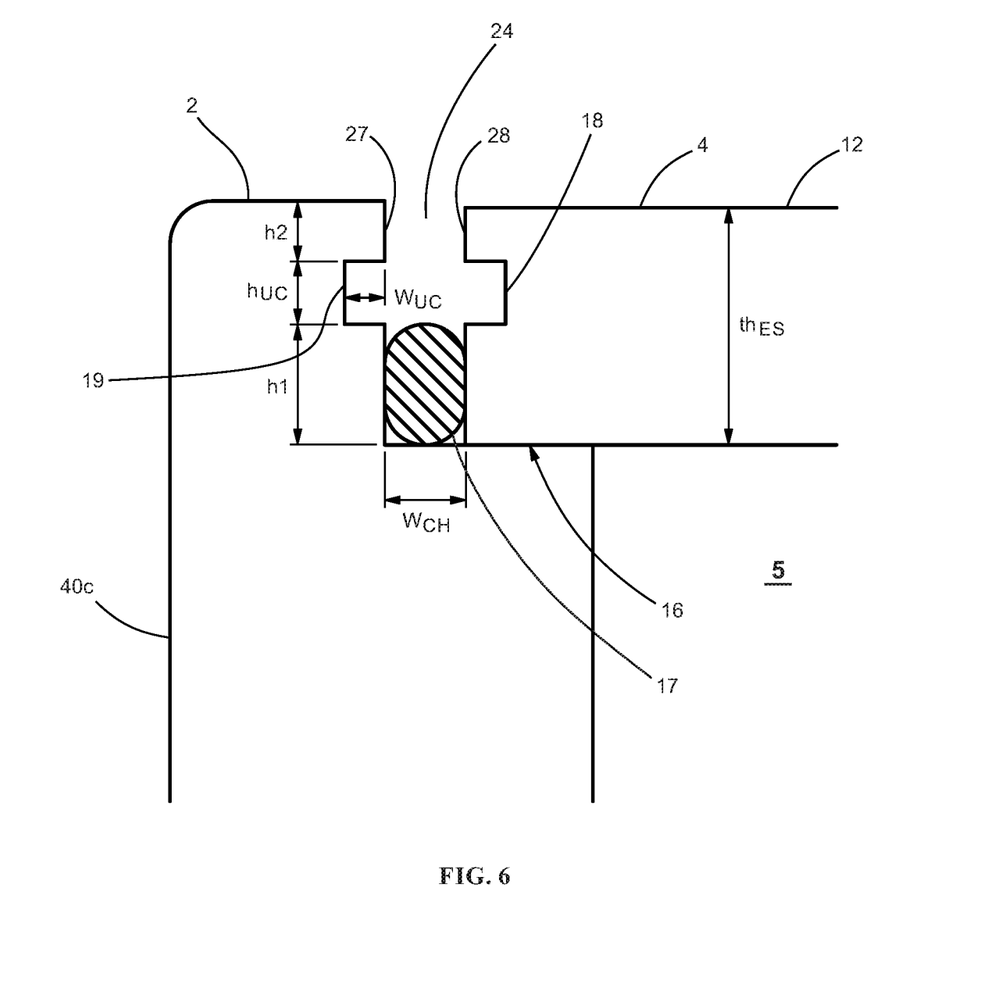
FIG. 6 is a cross-sectional side view of a portion of the enclosure of FIGS. 1, 2, and 4.
Figure 7:
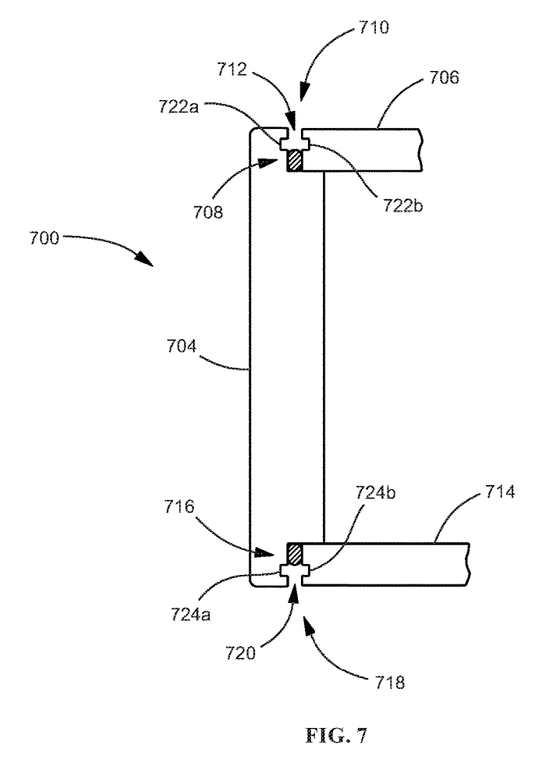
FIG. 7 is a cross-sectional side view of a portion of an example enclosure that includes a removeable base.

FIG. 7 is a cross sectional side view of a portion of another example implementation in the form of an enclosure 700 made in accordance with the present disclosure that includes a housing 702, which includes at least one wall 704, a removable cover 706 that is coupled to the wall 704 in substantially the same way as enclosure 10 (FIG. 1), namely, by positioning the removable cover in a stepped recess 708 of an upper portion of wall 704 and applying a seal 710 to a channel 712 defined by the stepped recess 708 and an outer perimeter of cover 706. Unlike enclosure 10, which includes a unitary housing with a non-removeable base, enclosure 700 includes a removeable base 714 that is coupled to wall 704 in a similar fashion as cover 706. In the illustrated example, base 714 is positioned in a stepped recess 716 in an lower portion of wall 704 and is coupled to the wall by applying a seal 718 to a channel 720 defined by the stepped recess 716 and an outer perimeter of base 714. In the illustrated example, both channels 712 and 720 include a plurality of sealant retaining grooves 722a, 722b, and 724a, 724b that have substantially the same configuration and function as sealant retaining grooves 18 and 19 (FIG. 6). One or both of cover 706 and base 714 may be an optical component designed to transmit light generated by a light emitting device located in enclosure 700. Although elements 706 and 714 are referred to as a cover and base, respectively, this is for convenience of description and does not limit the orientation of enclosure 700. In some examples enclosure 700 may be configured to be used in any orientation, including the base 714 being positioned on top, or enclosure 700 being positioned at any angle with respect to a horizontal surface.

Figure 8:
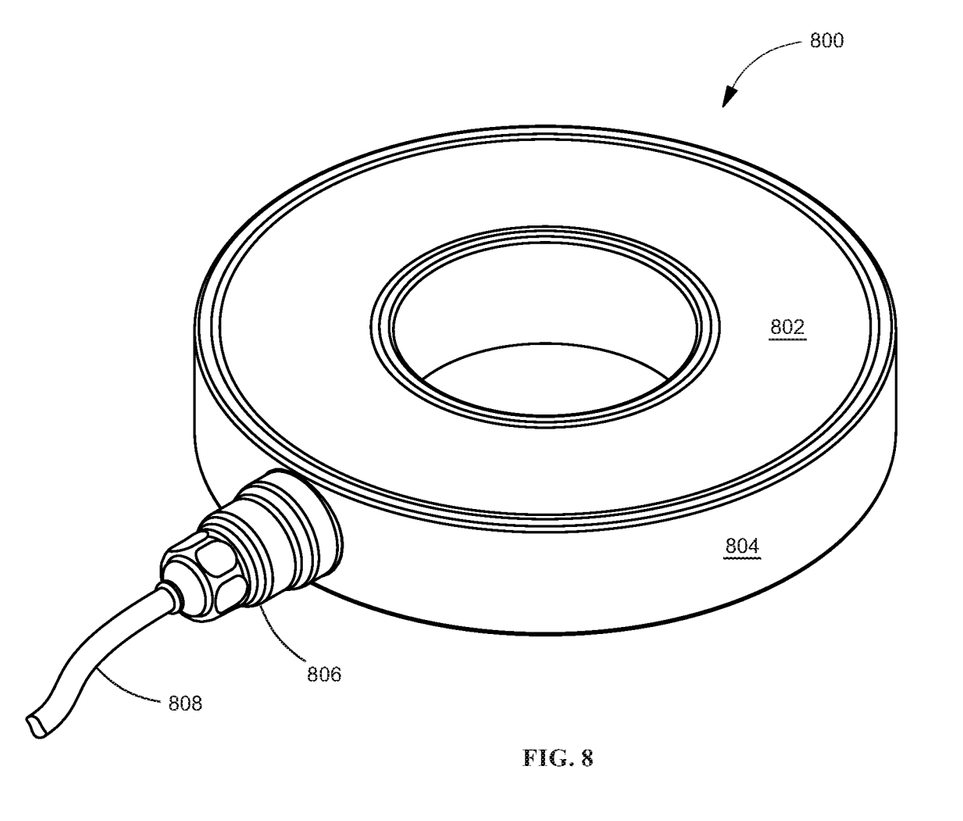
FIG. 8 illustrates one example of an enclosure having an annular shape.

In the example illustrated in FIG. 1, enclosure 10 has a rectangular shape, however, in other implementations an enclosure having one or more characteristics disclosed herein, including the sealing mechanisms disclosed herein may have any shape and aspect ratio, for example, a rectangular shape with any aspect ratio, including square and long elongate enclosures, as well as non-rectangular shapes, such as circular, oval, annular, or any polygon shape. As noted above, for any of the foregoing shapes, cover and/or base and/or walls may be optical components configured to transmit light generated by light emitting devices located in the enclosure. FIG. 8 illustrates one example implementation of an enclosure 800 having an annular shape. Enclosure 800 has a similar construction as enclosure 10, including a removeable cover 802 coupled to a housing 804 using any of the sealing mechanisms disclosed herein. Enclosure 800 includes a cord grip 806 and an electric cable 808 and is designed and configured to house one or more electrical components. Enclosure 800 also includes a base (not illustrated) which may or may not be removeable. In one example, enclosure 800 is a ring light and one or both of cover 802 and the base may be configured as optical components designed to transmit light generated by a light emitting device located in the enclosure.

Referring again to FIG. 1, sealant 13 is designed to be applied in fluid form and then solidify to provide a hermetic seal. In some examples, sealant is also designed to be removeable by pulling the sealant out of the channel while leaving minimal residue. Examples of sealant 13 include any of a variety of potting compounds or epoxies known in the art. In one non-limiting example, a commercially available material that may be used as sealant 13 is Tough-Seal 22™ (part number PC 2022A/B) manufactured by Key Polymer Corporation™ that, when cured has a 68A (shore A) durometer. Once in solid form, sealant 13 may have an elastic rubberized quality to maintain an adequate seal across a variety of temperatures and despite differing coefficients of thermal expansion between housing 11 and cover 12. Thus, in some examples, sealant 13 provides a thermally resilient seal.

Figure 2:
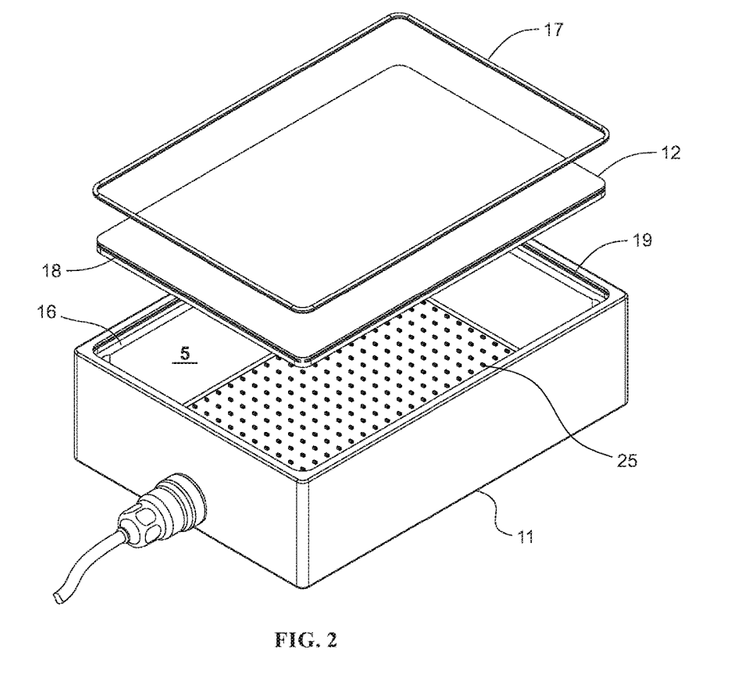
FIG. 2 is an exploded view of the enclosure of FIG. 1.

FIGS. 2, 4, and 6 illustrate exploded and cross sectional side views of enclosure 10 and illustrate sealant retaining grooves 18, 19 at the sealing juncture between the housing 11 and cover 12. In the illustrated example, each wall 40 of housing 11 includes a retaining groove 19 and cover 12 includes a complementary retaining groove 18 that extends around an entire outer edge of the cover. In other examples, a retaining groove may only be located on one side of channel 24 in walls 40 or cover 12. In some examples, only some of walls 40 and/or some sides of the cover may include a retaining groove. FIGS. 4 and 6 show enclosure 10 prior to the insertion of sealant 13 into sealant channel 24. Retaining grooves 18, 19 are designed and configured to secure the sealant 13 within channel 24. In one example, channel 24 cooperates with the adhesion of the sealant in the channel to provide a sufficient seal, for example, to meet a specified sealing rating, for example, a seal that meets or exceeds IP69K. In other examples, enclosure 10 may be designed and configured to meet a more or less stringent standard than IP69K. In the illustrated example, retaining grooves have a square cross section and extend horizontally into the walls 40 and cover 12. In other examples, the retaining grooves may have an alternate shape cross section, such as a half circle, half oval, or triangular, etc. and may extend into the walls and/or cover at a non-orthogonal angle with respect to vertical wall 27 or edge 28 (FIG. 6). In the illustrated example, each of vertical wall 27 and edge 28 include only one sealant retaining groove 18/19. In other examples, one or both of vertical wall 27 and edge 28 may contain a plurality of retaining grooves and/or only one of vertical wall 27 and edge 28 may contain one or more retaining grooves.

Figure 9:
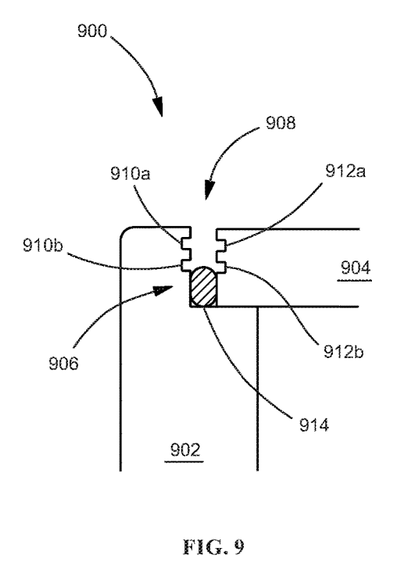
FIG. 9 is a cross-sectional side view of a portion of an example enclosure that includes a plurality of sealant retaining grooves.

FIG. 9 illustrates one example implementation of an enclosure 900 that has a similar construction to enclosure 10 (FIG. 1) and that includes at least one wall 902 and a removeable cover 904 disposed in a recess 906 located in a top portion of the wall. Recess 906 and an outer edge of cover 904 define a channel 908 that includes a plurality of sealant retaining grooves 910a, 910b, 912a, 912b, where recess 906 includes a plurality of sealant retaining grooves (sealant retaining grooves 910a, 910b) and the outer edge of cover 904 also includes a plurality of sealant retaining grooves (sealant retaining grooves 912a, 912b). In the illustrated example, each of the plurality of sealant retaining grooves 910 and 912 have a rectangular cross sectional shape. As shown in FIG. 9, channel 908 is designed for a seal that includes a gasket 914 and a sealant (not illustrated) that fills a remainder of channel 908.

Figure 10:
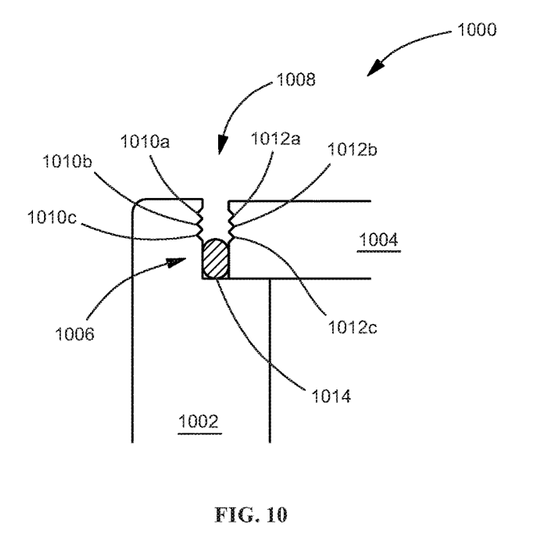
FIG. 10 is a cross-sectional side view of a portion of another example enclosure that includes a plurality of sealant retaining grooves.

FIG. 10 illustrates one example implementation of an enclosure 1000 that has a similar construction to enclosure 10 (FIG. 1) and that includes at least one wall 1002 and a removeable cover 1004 disposed in a recess 1006 located in a top portion of the wall. Recess 1006 and an outer edge of cover 1004 define a channel 1008 that includes a plurality of sealant retaining grooves 1010a-1010c, 1012a-1012-c, where recess 1006 includes a plurality of sealant retaining grooves (sealant retaining grooves 1010a-1010c) and the outer edge of cover 1004 also includes a plurality of sealant retaining grooves (sealant retaining grooves 1012a-1012c). In the illustrated example, each of the plurality of sealant retaining grooves 1010 and 1012 have a triangular cross sectional shape. As shown in FIG. 10, channel 1008 is designed for a seal that includes a gasket 1014 and a sealant (not illustrated) that fills a remainder of channel 1008.

Referring again to FIG. 6, example enclosure 10 includes walls 40 that include a stepped-shaped recess formed in an inner top portion of each wall that is defined by a vertical wall 27 and a support shelf 16, the support shelf configured and dimensioned to support cover 12. Vertical wall 27, an outer edge 28 of the cover, and support shelf 16 define a channel 24 that is configured and dimensioned to receive a seal, where the seal may include sealant 13 (FIG. 1) and a gasket 17. The gasket 17 serves a variety of functions, including centering the cover 12 within the housing 11, providing a barrier to the downward flow of sealant 13 from channel 24 to the cavity 5 below, and facilitating the removal of the sealant when disassembling and re-opening the enclosure. Gasket 17 may be formed from any of a variety of materials, for example, neoprene, EPDM, nitrile rubber or silicone. In some examples, gasket 17 may be a compliant cord stock, such as an O-ring cord stock, and have any cross sectional shape, including round, square, x-shaped, or annular. In alternate examples, gasket 17 may be omitted and channel 24 may be completely filled with sealant 13.

In the illustrated example, channel 24 has a width, $W_{CH}$, that is less than a diameter of gasket 17 when the gasket is in an uncompressed state to ensure a tight fit between the channel and gasket. For example, $W_{CH}$ may be at least 10% smaller than the diameter of gasket 17. Retaining grooves 18 and 19 may be located at a height, h1, above shelf 16 and in some examples, h1 may be selected to be greater than or equal to a height of gasket 17 when the gasket is in a compressed form and disposed in channel 24 and in contact with shelf 16. For example, as illustrated in FIG. 6, gasket 17 has an ovalized cross section due to being compressed within channel 24 and height h1 is approximately the same as the major diameter of the gasket when in the installed compressed ovalized configuration so that the sealant 13 within retaining grooves 18/19 is above the gasket. Retaining grooves 18 and 19 may also be located a minimum distance, h2 from top surfaces 2, 4. In one example, h2 is equal to or less than $W_{CH}$ and in some examples, the ratio of h2/$W_{CH}$ is in the range of ⅒ to 1 and in some examples, in the range of ⅕ to ½, and in some examples, is approximately equal to ⅓. Retaining grooves 18 and 19 may each also have a width, $W_{UC}$. In one example, both retaining grooves have substantially the same width and each width, $W_{UC}$ is approximately ½ of the channel width, $W_{CH}$. Cover 12 has a thickness $th_{ES}$ and a height, $h_{UC}$, of the retaining grooves may be selected so that $h1 \pm h_{UC} + h_2 = th_{ES}$. In some examples, channel 24 has a height that is designed and configured to receive gasket 17 and have a sufficient remaining height ($h_{UC}+h2$), also referred to herein as a sealant portion height to provide for a sufficient thickness of sealant 13 to form a durable hermetic seal. In one example, a ratio of the sealant portion height of channel 24 (the height of the channel 24 above the gasket 17 when the gasket is installed and in contact with support shelf 16, e.g., $h_{UC}+h2$) to the width of the channel, $W_{CH}$ is in the range of 1.5 to 2.5 and in some examples, in the range of 1.8 to 2.2 and in some examples, approximately 2.

Thus, the illustrated example enclosure 10 provides a hermetically sealed, hygienic enclosure without the use of mechanical fasteners such as screws, bolts, or latches and provides an arrangement of sides and bottom of housing 11 configured to be sealed with cover 12 using sealant 13 and gasket 17, where the sealant and gasket cooperate to form a hermetic seal between the walls 40 of the housing and the cover. Housing support shelf 16 is designed and configured to support the cover 12 while also providing the channel 24 between the housing and the cover. Gasket 17 is inserted into channel 24 between the housing walls 40 and the cover 12, serving to constrain lateral movement of the cover within the housing and to provide an initial level of sealing between the housing and the cover. Channel 24 formed between the housing and the cover is of sufficient depth to fully incorporate gasket 17 while leaving additional room above the gasket for the insertion of liquid sealant 13 into the remaining portion of the channel. Once cured, the sealant provides a hermetic seal between the housing and cover, providing a fastener-less, crevice-free device enclosure. Cover 12 is designed and configured to be removeably secured to housing 11 so that enclosure 10 can be opened and closed as needed, for example, to repair or replace electrical components 25. In the illustrated example, cover 12 can be removed from housing 11 by pulling sealant 13 and gasket 17 from channel 24. Gasket 17 facilitates the removal of the sealant. For example, a cutting element (not illustrated) may be inserted into channel 24 to cut the sealant and gasket, an end of the gasket can then be pulled out of the channel, and then continuously pulled from channel to thereby remove the sealant and gasket for opening the enclosure.

Figure 3:
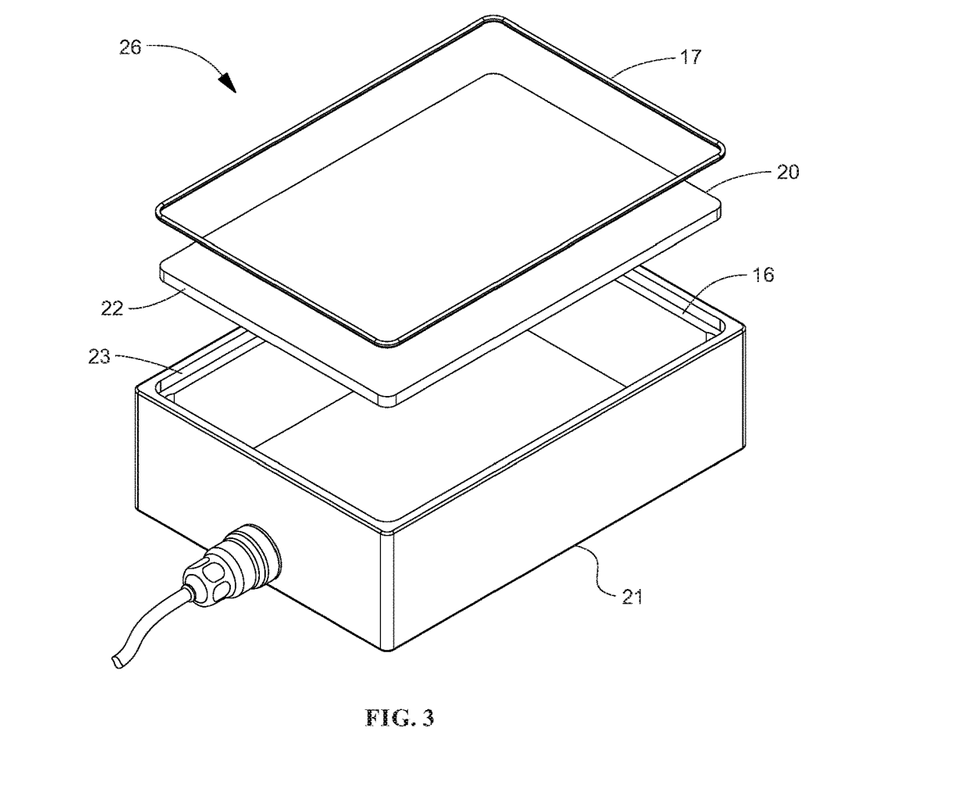
FIG. 3 is an exploded view of an example implementation of an electrical enclosure that does not include sealant retaining grooves.
Figure 5:
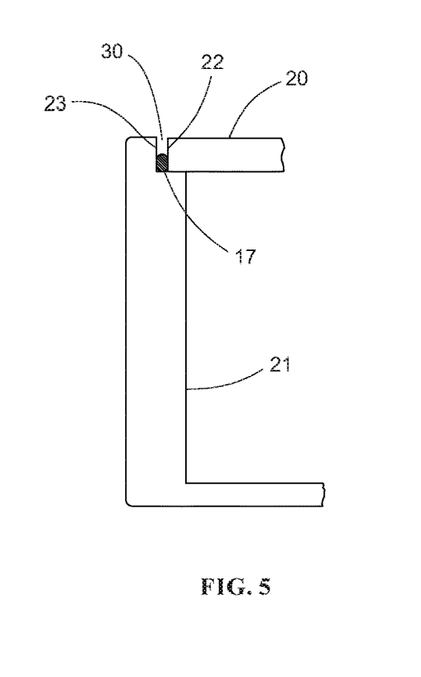
FIG. 5 is a cross-sectional side view of the electrical enclosure of FIG. 3.

FIG. 3 illustrates an exploded view of another example of an enclosure 26 that is substantially the same as enclosure 10, but that does not include retaining grooves 18 and 19 at the sealing juncture between a housing 21 and cover 20. FIG. 5 shows a cross-sectional side view through the partially assembled enclosure 26 where the non-grooved edge 23 in housing 21 and a non-grooved edge 22 in cover 20 is shown prior to the insertion of a sealant into a sealant channel 30. Sealant channel 30 may have similar dimensions to channel 24, including a width that is less than a diameter of gasket 17 and a height sufficient to receive the gasket and a minimum amount of sealant needed to form an adequate seal between housing 21 and cover 20. In a similar manner as to the construction illustrated in FIGS. 1, 2, and 4, gasket 17 in FIG. 5 serves to center the cover 20 within the housing 21 as well as to provide a barrier to the downward flow of sealant 13 out of the sealant channel 30 and into the cavity below. In alternate examples, gasket 17 may be omitted and channel may be completely filled with sealant.

The foregoing has been a detailed description of illustrative embodiments of the disclosure. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this disclosure. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present disclosure. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this disclosure.

What is claimed is:

1. An enclosure, comprising:
   a housing that includes a plurality of walls, each of the walls having a stepped recess in a top portion of the wall that includes a support shelf;
   a removeable cover disposed on the support shelf, wherein an outer edge of the cover and the stepped recess define a channel; and
   a seal disposed in the channel, the seal including a gasket and a sealant that fills a remainder of the channel;
   wherein the sealant is flush with a top surface of the housing and a top surface of the removable cover.

2. The enclosure of claim 1, wherein the gasket is in contact with the support shelf, the sealant extending from the gasket to an outer surface of the removeable cover.

3. The enclosure of claim 1, wherein the sealant is substantially flush with an outer surface of the removeable cover and an outer surface of one of the plurality of walls.

4. The enclosure of claim 1, further comprising at least one sealant retaining groove located in the stepped recess and/or in the outer edge of the cover, wherein the sealant extends from the channel into the sealant retaining groove.

5. The enclosure of claim 4, wherein the at least one sealant retaining groove includes a plurality of sealant retaining grooves located in the stepped recess and/or in the outer edge of the cover.

6. The enclosure of claim 4, wherein the at least one sealant retaining groove includes a first sealant retaining groove in the stepped recess and a second sealant retaining groove in the outer edge of the cover.

7. The enclosure of claim 6, wherein the first and second sealant retaining grooves are located above a top surface of the gasket when the gasket is installed in the channel.

8. The enclosure of claim 6, wherein the channel includes an upper portion located above the first and second sealant retaining grooves, wherein a height of the upper portion is less than or equal to a width, w, of the channel.

9. The enclosure of claim 8, wherein the channel has a sealant portion height, h, that extends from a top surface of the gasket to a top surface of the cover when the gasket is disposed in the channel and in contact with the support shelf, wherein a ratio of the sealant portion height to the channel width (h/w) is between 1.5 and 2.5.

10. The enclosure of claim 4, wherein a bottom edge of the at least one sealant retaining groove is located at or above a top surface of the gasket when the gasket is installed in the channel.

11. The enclosure of claim 1, wherein a width of the channel is less than a width of the gasket when the gasket is in an uncompressed form prior to installation of the gasket in the channel.

12. The enclosure of claim 1, wherein the housing further includes a second stepped recess located in a bottom portion of the walls, the enclosure further comprising a removeable base disposed in the second stepped recess and a second seal disposed in a channel located between the removeable base and the lower portion of the walls.

13. The enclosure of claim 1, further comprising a base, wherein at least one of the cover and base is an optical component designed to transmit light emitted by a light emitting element located in the enclosure.

14. The enclosure of claim 1, wherein the enclosure is fastener-less and does not include any mechanical fasteners for securing the cover to the housing.

15. The enclosure of claim 1, wherein the seal is a hermetic seal, the enclosure designed and configured to meet or exceed an International Electrotechnical Commission rating level of IP69K.

16. The enclosure of claim 1, wherein the enclosure is a backlight designed and configured for use in an industrial machine vision application.

17. A method of performing a machine vision inspection process during a manufacturing process, the method comprising:
   illuminating an object with light emitted from the enclosure of claim 1.

18. The method of claim 17, wherein the manufacturing process is a food or medical device manufacturing process.

19. A method of manufacturing an enclosure that includes a housing having a stepped recess in a top portion of the housing and a removeable cover, the method comprising:
   locating the removeable cover in the stepped recess of the housing to thereby form a channel located between the removeable cover and the stepped recess,
   placing a gasket in the channel; and
   filling the channel with a fluid sealant, wherein the fluid sealant cures into a rubberized solid after installation;

wherein the filling step includes filling the channel with the fluid sealant until the fluid sealant is flush with a top surface of the housing and a top surface of the removable cover.

20. The method of claim 19, wherein the filling step further includes filling at least one sealant retaining groove with the fluid sealant, the sealant retaining groove located in at least one of the stepped recess and the removeable cover, wherein the sealant retaining groove is in fluid communication with the channel.

21. The method of claim 19, wherein the filling step further includes filling a plurality of sealant retaining grooves with the fluid sealant, the plurality of sealant retaining grooves located in at least one of the stepped recess and the removeable cover, wherein the plurality of sealant retaining grooves are in fluid communication with the channel.

22. An enclosure, comprising:
a housing that includes a plurality of walls, each of the walls having a stepped recess in a top portion of the wall that includes a support shelf;
a removeable cover disposed on the support shelf, wherein an outer edge of the cover and the stepped recess define a channel; and
a seal disposed in the channel, the seal including a gasket and a sealant that fills a remainder of the channel;
wherein the gasket is in contact with the support shelf, the sealant extending from the gasket to an outer surface of the removeable cover.

23. An enclosure, comprising:
a housing that includes a plurality of walls, each of the walls having a stepped recess in a top portion of the wall that includes a support shelf;
a removeable cover disposed on the support shelf, wherein an outer edge of the cover and the stepped recess define a channel;
a seal disposed in the channel, the seal including a gasket and a sealant that fills a remainder of the channel; and
a first sealant retaining groove in the stepped recess and a second sealant retaining groove in the outer edge of the cover, wherein the sealant extends from the channel into the sealant retaining grooves.

24. An enclosure, comprising:
a housing that includes a plurality of walls, each of the walls having a stepped recess in a top portion of the wall that includes a support shelf and a second stepped recess located in a bottom portion of the walls;
a removeable cover disposed on the support shelf, wherein an outer edge of the cover and the stepped recess define a channel;
a seal disposed in the channel; and
a removeable base disposed in the second stepped recess and a second seal disposed in a channel located between the removeable base and the lower portion of the walls.

* * * * *